US010667423B2

(12) United States Patent
Morihata et al.

(10) Patent No.: US 10,667,423 B2
(45) Date of Patent: May 26, 2020

(54) CONNECTOR COOLING AND STATUS INDICATOR SYSTEM

(71) Applicant: Dell Products L.P., Round Rock, TX (US)

(72) Inventors: Michael Morihata, Santa Clara, CA (US); Joanne Cuijuan Zhang, San Jose, CA (US); Kaixuan Hu, Fremont, CA (US)

(73) Assignee: Dell Products L.P., Round Rock, TX (US)

( * ) Notice: Subject to any disclaimer, the term of this patent is extended or adjusted under 35 U.S.C. 154(b) by 10 days.

(21) Appl. No.: 16/172,474

(22) Filed: Oct. 26, 2018

(65) Prior Publication Data

US 2020/0137915 A1 Apr. 30, 2020

(51) Int. Cl.
*H05K 7/14* (2006.01)
*H05K 7/20* (2006.01)

(52) U.S. Cl.
CPC ....... *H05K 7/1481* (2013.01); *H05K 7/20154* (2013.01)

(58) Field of Classification Search
USPC .................................. 361/692, 679.33, 695
See application file for complete search history.

(56) References Cited

U.S. PATENT DOCUMENTS

| 3,602,774 | A | * | 8/1971 | Grant | G01R 31/2642 361/695 |
| 3,767,974 | A | * | 10/1973 | Donovan, Jr. | H05K 7/1409 361/798 |
| 3,833,837 | A | * | 9/1974 | West | H05K 7/20909 361/694 |
| 4,027,206 | A | * | 5/1977 | Lee | H05K 7/20909 361/697 |
| 4,122,508 | A | * | 10/1978 | Rumbaugh | H05K 7/20563 165/80.3 |
| 4,539,469 | A | * | 9/1985 | Gigandet | F24C 15/006 219/388 |
| 5,119,497 | A | * | 6/1992 | Freige | G06F 1/181 361/679.33 |
| 5,248,193 | A | * | 9/1993 | Schlemmer | A47B 91/00 248/615 |
| 5,440,450 | A | * | 8/1995 | Lau | G06F 1/20 361/695 |

(Continued)

*Primary Examiner* — William H. Mayo, III
*Assistant Examiner* — Krystal Robinson
(74) *Attorney, Agent, or Firm* — Haynes and Boone, LLP (57) ABSTRACT

A connector cooling and status indication system includes a connector chassis that defines a connector aperture, an airflow aperture located adjacent the connector aperture, and a status indicator aperture that is located adjacent the connector aperture. A connector subsystem includes a connector that is located immediately adjacent the connector aperture, and a heat dissipation device extends from the connector subsystem and defines at least one heat dissipation device channel that is configured to channel an airflow received via the airflow aperture. A status indicator subsystem includes a light emitting element that is located immediately adjacent the status indicator aperture, and is positioned adjacent the connector subsystem such that no portion of the status indicator subsystem impedes the airflow that is received via the airflow aperture and channeled by the at least one heat dissipation device channel.

20 Claims, 9 Drawing Sheets

(56) References Cited

U.S. PATENT DOCUMENTS

| | | | | |
|---|---|---|---|---|
| 5,469,037 A * | 11/1995 | McMurtrey, Sr. | G11B 33/02 | 312/223.2 |
| 5,493,474 A * | 2/1996 | Schkrohowsky | G11B 33/142 | 361/695 |
| 5,526,229 A * | 6/1996 | Wakabayashi | B41J 29/00 | 361/690 |
| 5,557,506 A * | 9/1996 | Wood | H05K 7/1429 | 361/729 |
| 5,673,029 A * | 9/1997 | Behl | G06F 1/20 | 340/584 |
| 5,737,194 A * | 4/1998 | Hopkins | H05K 7/1461 | 361/728 |
| 5,761,029 A * | 6/1998 | Jay | G06F 1/18 | 361/679.33 |
| 5,882,595 A * | 3/1999 | La Motte | B01L 7/52 | 422/547 |
| 5,886,639 A * | 3/1999 | Behl | G06F 1/20 | 340/584 |
| 5,930,112 A * | 7/1999 | Babinski | H02M 7/003 | 361/695 |
| 5,940,288 A * | 8/1999 | Kociecki | H05K 7/20727 | 361/688 |
| 6,198,642 B1 * | 3/2001 | Kociecki | H02M 1/4225 | 307/150 |
| 6,246,576 B1 * | 6/2001 | Sands | G06F 1/183 | 361/679.02 |
| 6,310,776 B1 * | 10/2001 | Byrne | H01L 23/367 | 174/16.3 |
| 6,335,868 B1 * | 1/2002 | Butterbaugh | G06F 1/181 | 220/4.02 |
| 6,351,786 B2 * | 2/2002 | Elmore | | 710/300 |
| 6,516,954 B2 * | 2/2003 | Broome | H05K 7/186 | 211/26 |
| 6,611,428 B1 * | 8/2003 | Wong | H05K 7/20572 | 165/104.33 |
| 6,661,657 B1 * | 12/2003 | Banton | G06F 1/181 | 165/104.33 |
| 7,112,131 B2 * | 9/2006 | Rasmussen | H05K 7/20572 | 361/691 |
| 7,898,799 B2 * | 3/2011 | Doll | H05K 7/20736 | 312/223.2 |
| 8,449,331 B2 * | 5/2013 | Phillips | H01R 13/6581 | 439/607.21 |
| 8,564,951 B1 * | 10/2013 | Watanabe | H05K 7/20736 | 165/104.33 |
| 8,773,852 B2 * | 7/2014 | Singleton | H05K 7/20836 | 165/104.33 |
| 8,947,884 B1 * | 2/2015 | Grimm | H05K 7/142 | 361/679.31 |
| 9,451,719 B2 * | 9/2016 | Ismayilov | H05K 7/026 | |
| 9,825,408 B2 * | 11/2017 | Henry | H01R 13/6596 | |
| 2002/0101721 A1 * | 8/2002 | Blood | H05K 7/1489 | 361/724 |
| 2002/0172007 A1 * | 11/2002 | Pautsch | H01L 23/4735 | 361/690 |
| 2002/0173278 A1 * | 11/2002 | Fritz | H04B 1/08 | 455/575.1 |
| 2002/0180405 A1 * | 12/2002 | Batson | H02J 7/0047 | 320/128 |
| 2003/0046452 A1 * | 3/2003 | Andrewartha | G06F 1/181 | 710/2 |
| 2003/0196292 A1 * | 10/2003 | Sams | A47L 5/38 | 15/314 |
| 2004/0227435 A1 * | 11/2004 | Rasmussen | H05K 7/20572 | 312/236 |
| 2006/0063411 A1 * | 3/2006 | Kim | H01R 13/6315 | 439/247 |
| 2008/0074839 A1 * | 3/2008 | Tamaki | G06F 1/20 | 361/679.46 |
| 2009/0020330 A1 * | 1/2009 | Kitamura | H05K 7/1421 | 174/535 |
| 2009/0258534 A1 * | 10/2009 | Bright | H01R 13/7172 | 439/490 |
| 2010/0061069 A1 * | 3/2010 | Cole | G02B 6/4246 | 361/761 |
| 2010/0124846 A1 * | 5/2010 | Peets | H05K 9/0016 | 439/607.18 |
| 2010/0164736 A1 * | 7/2010 | Byers | H04L 12/12 | 340/657 |
| 2010/0203750 A1 * | 8/2010 | Boetzer | H05K 7/1409 | 439/159 |
| 2011/0110048 A1 * | 5/2011 | Lima | H05K 7/20418 | 361/720 |
| 2011/0182027 A1 * | 7/2011 | Lima | G06F 1/20 | 361/679.46 |
| 2014/0016268 A1 * | 1/2014 | Tsujimura | G06F 1/20 | 361/695 |
| 2014/0111932 A1 * | 4/2014 | Fukuda | G11B 33/128 | 361/679.33 |
| 2014/0268599 A1 * | 9/2014 | Laufer | H05K 7/1461 | 361/752 |
| 2014/0376174 A1 * | 12/2014 | Dean | G06F 1/186 | 361/679.46 |
| 2015/0077922 A1 * | 3/2015 | Herman | H05K 7/1489 | 361/679.33 |
| 2015/0124404 A1 * | 5/2015 | Shen | H01R 13/62994 | 361/694 |
| 2015/0170484 A1 * | 6/2015 | Kuzmack | H05K 7/1487 | 340/635 |
| 2015/0173249 A1 * | 6/2015 | McGrath | G11B 33/142 | 361/679.33 |
| 2015/0249308 A1 * | 9/2015 | Recce | H01R 13/641 | 439/490 |
| 2015/0362167 A1 * | 12/2015 | Auyeung | F21V 29/502 | 362/555 |
| 2016/0073544 A1 * | 3/2016 | Heyd | G11B 33/128 | 361/679.31 |
| 2016/0165750 A1 * | 6/2016 | Tang | H05K 7/20181 | 361/692 |
| 2016/0174412 A1 * | 6/2016 | Karaaslan | H05K 7/20563 | 361/692 |
| 2018/0295737 A1 * | 10/2018 | Balasubramanian | G06F 1/18 | |
| 2019/0036093 A1 * | 1/2019 | Mueller | H01M 2/348 | |

* cited by examiner

CONNECTOR COOLING AND STATUS INDICATOR SYSTEM

BACKGROUND

The present disclosure relates generally to information handling systems, and more particularly to providing a connector status indicator for a connector in an information handling system while ensuring cooling of that connector.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, networking devices, storage devices, and/or other computing devices often utilize connectors for allowing connections to those computing devices. Furthermore, the operation of those connectors can produce relatively large amount of heat that must be dissipated using heat dissipation structures provided on the connectors. For example, Quad Small Form-factor Pluggable Double Density (QSFP-DD) optical cable connectors produce relatively large amounts of heat, and are typically provided with heat sinks located on a top surface of the QSFP-DD connector that include spaced apart fins that are provided to conduct heat generated by the QSFP-DD connector so that the heat may be dissipated by an airflow that moves past those fins. However, many conventional computing devices also provide status indicators (e.g., connector status indicators or other computing device subsystem status indicators known in the art) that are visible adjacent the portion of the QSFP-DD connector that is accessible on an outer surface of the chassis of the computing device, and the provisioning of those status indicators raises some issues.

For example, conventional status indicators utilized with QSFP-DD connectors are provided via a rigid light pipe structure that is mounted to the QSFP-DD connector, with rigid light pipes that extends between the fins on the heat sink to route each of the rigid light pipes to respective status indicator apertures that are defined on the chassis of the computing device adjacent the connector apertures defined on the chassis of the computing device that provide access to the QSFP-DD connector. The positioning of the status indicator apertures on the chassis prevents airflow apertures from being positioned immediately adjacent the connector apertures, and results in the provisioning of airflow apertures opposite the status indicator apertures from the connector apertures. As such, conventional status indicators reduce the amount of airflow from entering and/or exiting the chassis of the computing device through airflow apertures, and result in a reduction of airflow from being channeled between the fins of the heat sink. Thus, such conventional status indicators utilized with such connectors provide status indications at the expense of the cooling of those connectors.

Accordingly, it would be desirable to provide an improved connector cooling and status indicator system.

SUMMARY

According to one embodiment, an Information Handling System (IHS) includes a chassis; a connector subsystem that includes a connector that is accessible on an outer surface of the chassis; a heat dissipation device that extends from the connector subsystem and that defines at least one heat dissipation device channel that is configured to channel an airflow received from outside the chassis; and a status indicator subsystem that includes a light emitting element that is viewable on an outer surface of the chassis, wherein the status indicator subsystem is positioned adjacent the connector subsystem such that no portion of the status indicator subsystem impedes the airflow that is received from outside the chassis and channeled by the at least one heat dissipation device channel.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
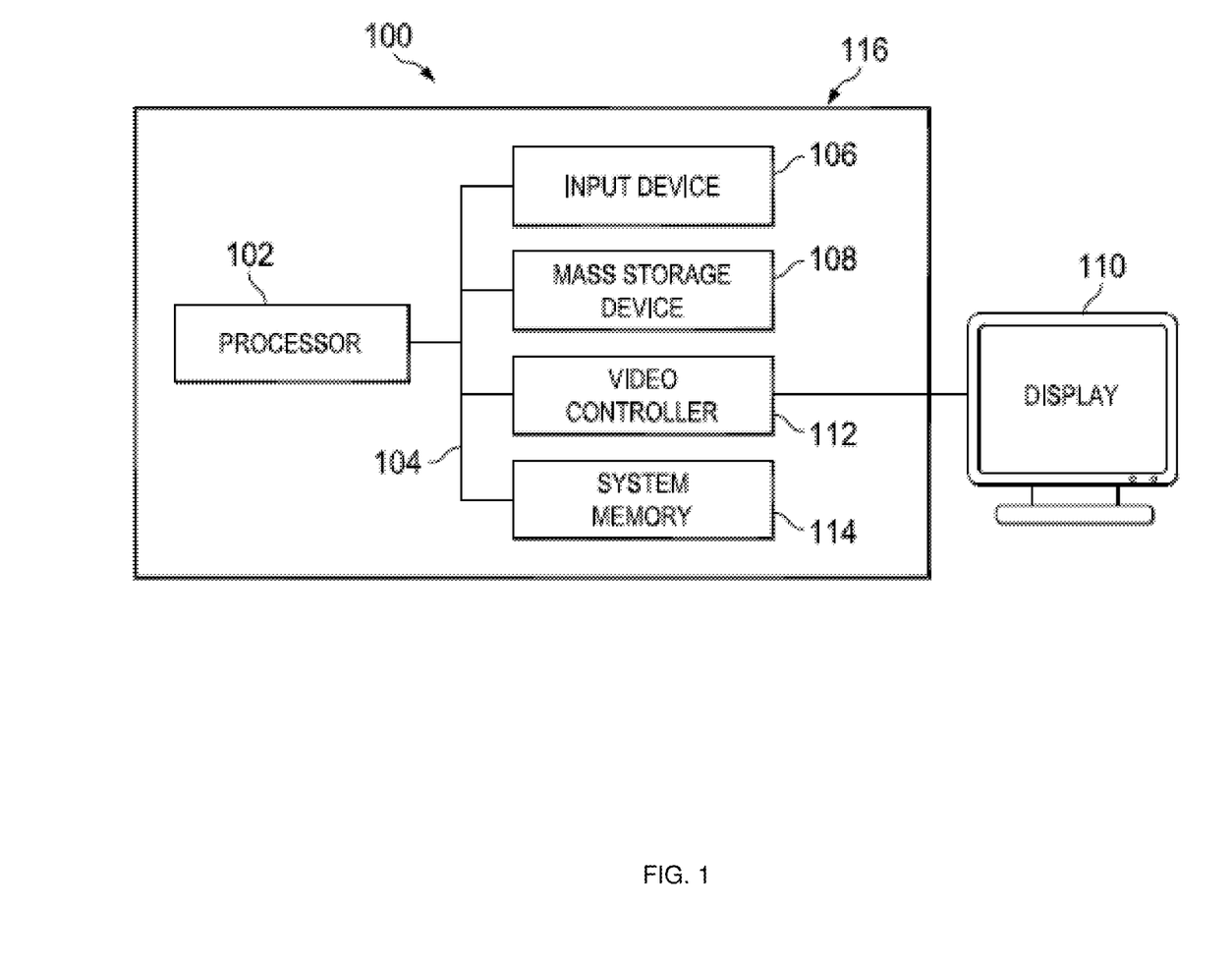
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
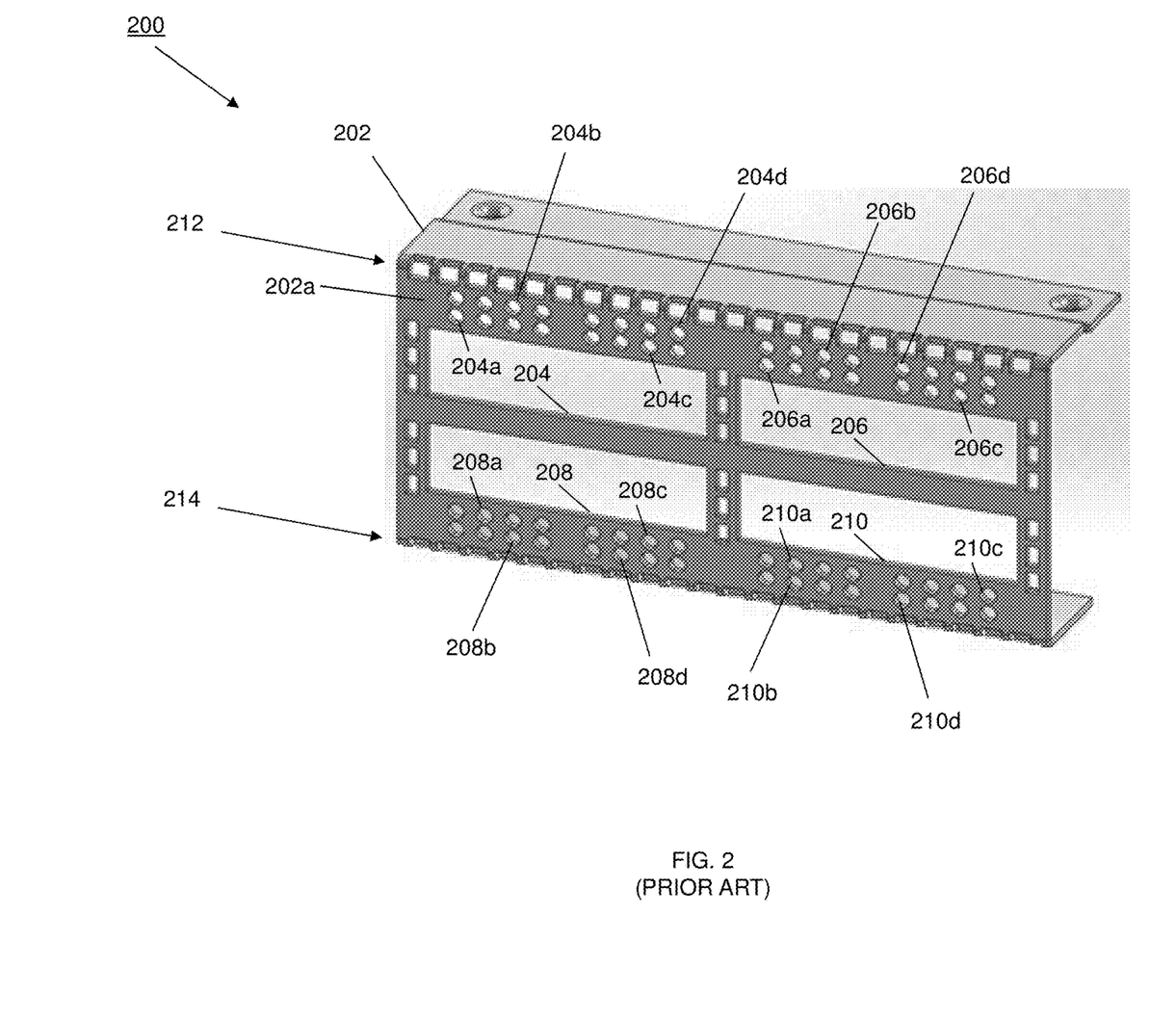
FIG. 2 is a perspective view illustrating an embodiment of a conventional connector chassis.

Referring now to FIG. 2, an embodiment of a conventional connector chassis 200 is illustrated. As would be understood by one of skill in the art in possession of the present disclosure, the conventional connector chassis 200 is provided in, or included as part of, a computing device chassis such as, for example the chassis 116 of the IHS 100 discussed above with reference to FIG. 1. In the illustrated embodiment, the conventional connector chassis 200 includes a base 202 having a wall 202a that may, for example, provide an outer surface of the chassis 116. However, in other embodiments, the base 202 may be positioned in the chassis 116 such that the wall 202a engages an inner surface of the chassis 116 so that the features of the conventional connector chassis 200 are accessible through that chassis 116 (e.g., via one or more apertures defined by the chassis 116.) As such, in specific embodiments, the conventional connector chassis 200 may be integrated in, provided by, or otherwise incorporated on a panel, bezel, or other component providing an outer surface of a computing chassis.

In the illustrated embodiment, the base 202 of the conventional connector chassis 200 defines a connector aperture 204 that extends through the wall 202a, a connector aperture 206 that extends through the wall 202a, a connector aperture 208 that extends through the wall 202a, and a connector aperture 210 that extends through the wall 202a. One of skill in the art in possession of the present disclosure will recognize that the embodiment of the conventional connector chassis 200 illustrated in FIG. 2 provides connector apertures 204, 206, 208, and 210 that are configured to provide access to four Quad Small Form-factor Pluggable Double Density (QSFP-DD) connector subsystems. However, one of skill in the art in possession of the present disclosure will recognize that other conventional connector chassis with connector apertures configured for different types of connectors may be modified according to the teachings of the present disclosure as well.

In the illustrated embodiment, the base 202 of the conventional connector chassis 200 defines status indicator apertures associated with each respective connector aperture. For example, the base 202 of the conventional connector chassis 200 defines a plurality of status indicator apertures that are associated with the connector aperture 204, that extend through the wall 202a, and that include status indicator apertures 204a, 204b, 204c, and up to 204d; a plurality of status indicator apertures that are associated with the connector aperture 206, that extend through the wall 202a, and that include status indicator apertures 206a, 206b, 206c, and up to 206d; a plurality of status indicator apertures that are associated with the connector aperture 208, that extend through the wall 202a, and that include status indicator apertures 208a, 208b, 208c, and up to 208d; and a plurality of status indicator apertures that are associated with the connector aperture 210, that extend through the wall 202a, and that include status indicator apertures 210a, 210b, 210c, and up to 210d. However, while each of the connector apertures 204, 206, 208, and 210 are illustrated as associated with a particular number of status indicator apertures (e.g., 16 status indicator apertures each in the illustrated embodiment), one of skill in the art in possession of the present disclosure will recognize that conventional connector chassis may utilize fewer or more status indicator apertures in different situations as well. A plurality of airflow apertures 212 are provided in a row above the status indicator apertures 204a-d and 206a-d, and a plurality of airflow apertures 214 are provided in a row below the status indicator apertures 208a-d and 210a-d Referring now to FIG. 3A, an embodiment of a connector subsystem 300 is illustrated. As would be understood by one of skill in the art in possession of the present disclosure, the connector subsystem 300 is illustrated and described herein as a QSFP-DD connector subsystem, but other connector subsystems may benefit from the teachings of the present disclosure and thus are envisioned as falling within its scope as well. In the illustrated embodiment, the connector subsystem 300 includes a base 302 having a top surface 302a, and defining a pair of connector channels 302b and 302c that extend into the base 302. While not illustrated or described in detail with reference to FIG. 3A, one of skill in the art in possession of the present disclosure will recognize that the base 302 may house connector components (e.g., QSFP-DD connector components) that are accessible via the connector channels 302b and 302c (e.g., by a connector inserted in those connector channels 302b and 302c), as well as connector components that extend from a bottom surface of the base 302 that is located opposite the base 302 from the top surface 302a (e.g., in order to connect to a board and allow the connector subsystem 300 to communicate with components coupled to that board, as discussed in the examples below.)

Figure 3A:
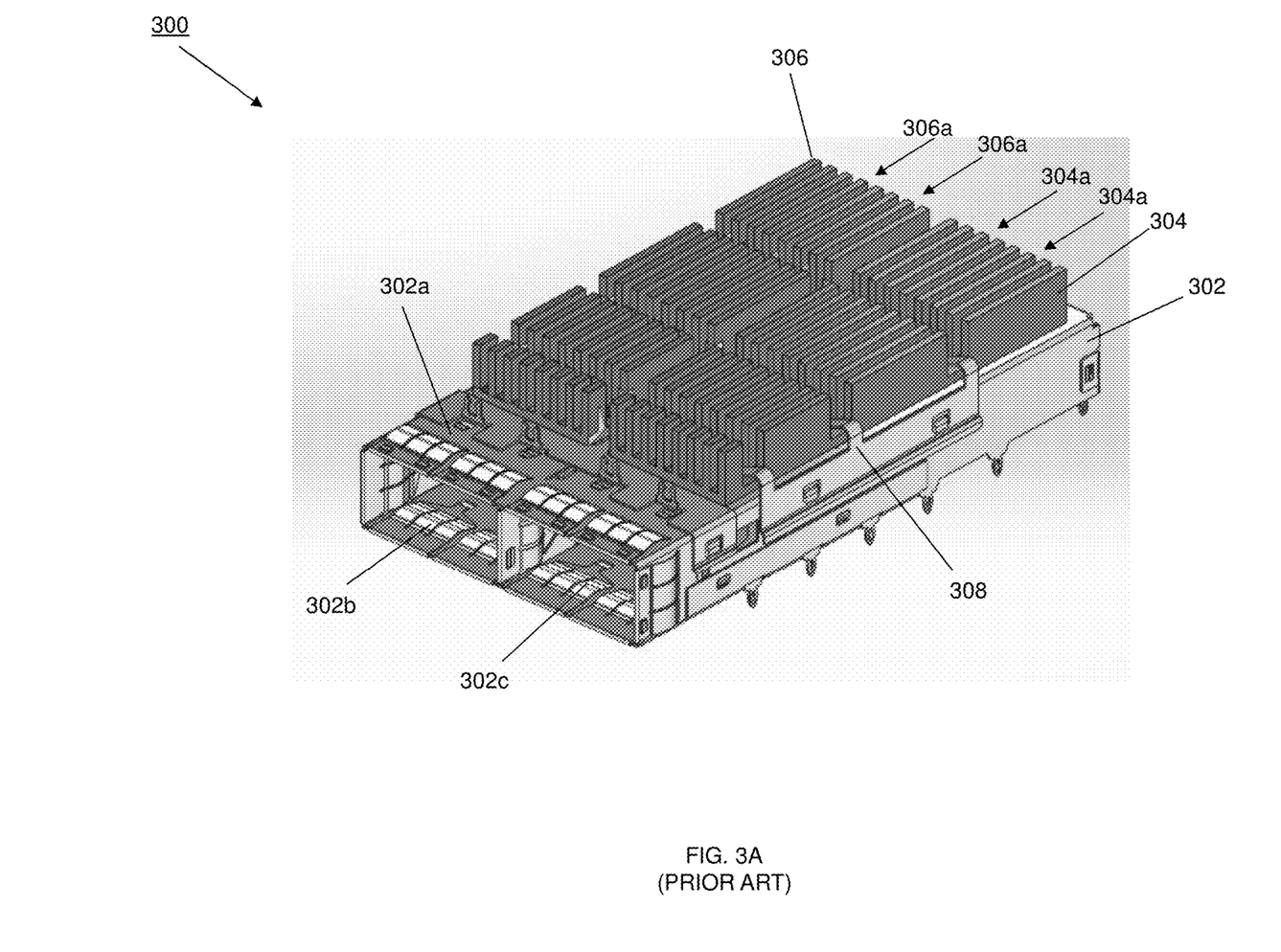
FIG. 3A is a perspective view illustrating an embodiment of a connector subsystem.

In the illustrated embodiment, a pair of heat dissipation devices 304 and 306 are included on the top surface 302a of the base 302. As would be understood by one of skill in the art in possession of the present disclosure, the heat dissipation devices 304 and 306 may be connected, mounted, and/or otherwise engaged with the top surface 302a of the base 302 in order to provide for heat transfer from the base 302 (e.g., heat generated by connector components located in the base 302 and transferred via the top surface 302a of the base 302, heat generated by connector components that extend through an opening on the top surface 302a and into engagement with the heat dissipation devices 304 and 306, connectors that are inserted in the connector channels 302b and 302c and that extend through the top surface 302a and into direct contact with the heat dissipation devices 304 and 306, etc.). In some embodiments, heat transfer substrates (e.g., a thermal paste) may be provided between the heat dissipation devices 304 and 306 and the top surface 302a of the base 302. As can be seen in FIG. 3A, the heat dissipation device 304 is secured to the top surface 302a of the base 302 via a securing member 308 that engages each of the heat dissipation device 304 and the base 302, and one of skill in the art in possession of the present disclosure will recognize that a similar securing member (not visible in FIG. 3A) may secure the heat dissipation device 306 to the top surface 302a of the base 302 as well. In the illustrated embodiment, the heat dissipation devices 304 and 306 each define a plurality of respective heat dissipation device channels 304a and 306a which extend along the length of each of the heat dissipation devices 304 and 306, respectively. As will be appreciated by one of skill in the art, the heat dissipation devices 304 and 306 illustrated in FIG. 3A are provided by finned heat sinks, with the fins of those heat sinks extending substantially perpendicularly relative to the top surface 302a of the base 302 and in a spaced apart orientation from each other such that channels (i.e., the heat dissipation device channels discussed above) are defined between each pair of adjacent fins. However, other types of heat dissipation devices may benefit from the teachings of the present disclosure, and thus are envisioned as falling within the scope of the present disclosure as well.

Figure 3B:
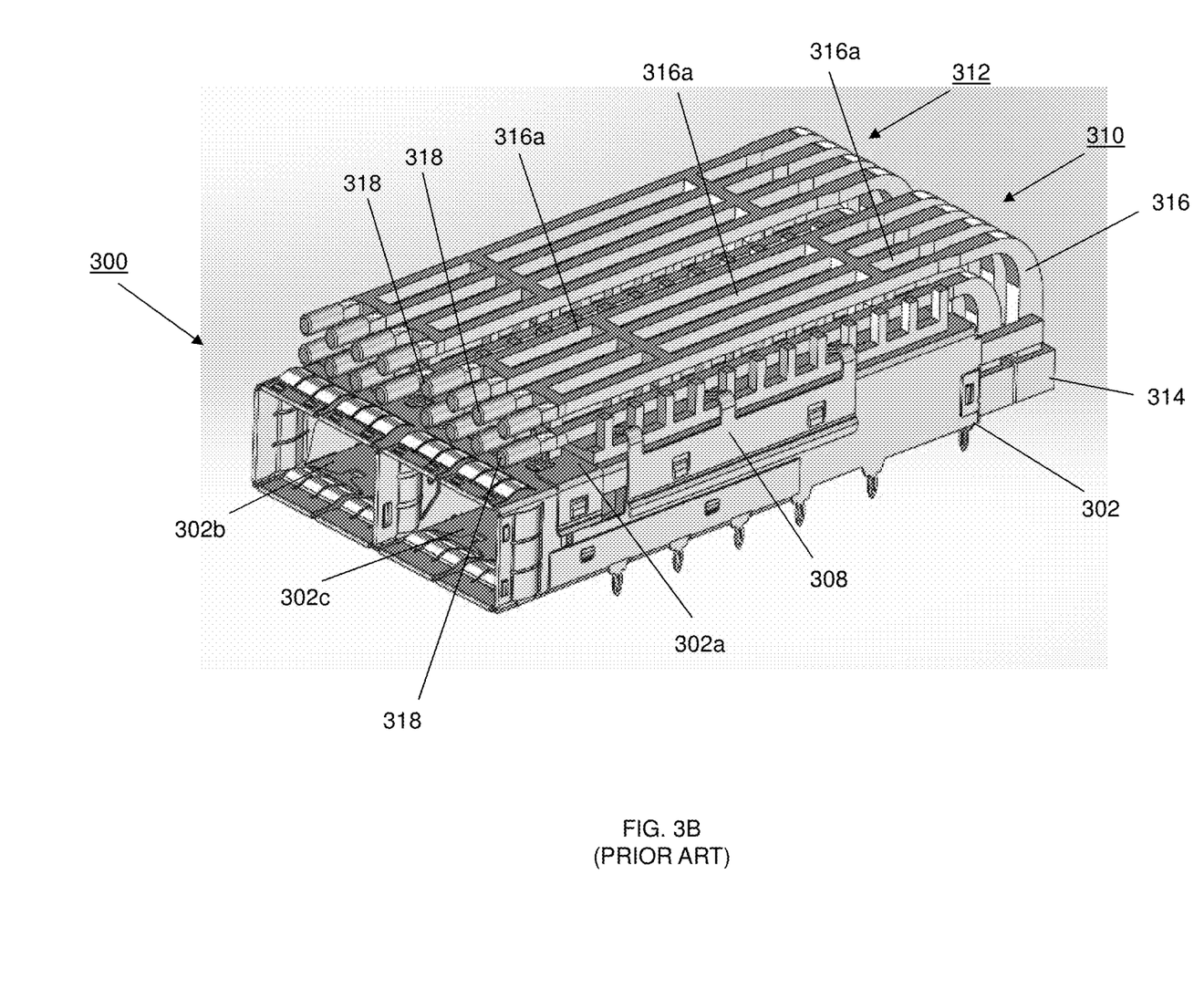
FIG. 3B is a perspective view illustrating an embodiment of conventional status indicator subsystems provided with the connector subsystem of FIG. 3A.

Referring now to FIG. 3B, the embodiment of the connector subsystem 300 is illustrated with the finned heat dissipation devices 304 and 306 of FIG. 3A removed, and with a pair of conventional status indicator subsystems 310 and 312 added. As such, the same reference numbers provided in the description of the connector subsystem 300 with reference to FIG. 3A are used in FIG. 3B. In the illustrated embodiment, the conventional status indicator subsystem 310 includes a status indicator board connector 314, with a status indicator frame 316 extending from the status indicator board connector 314. The status indicator frame 316 is configured with a substantially 90 degree bend such that a portion of the status indicator frame 316 extends substantially parallel to the top surface 302a of the base 302. As can be seen in FIG. 3B, the status indicator frame 316 includes a plurality of rigid light pipes 318 (e.g., eight rigid light pipes in the illustrated embodiment), and the status indicator frame 316/rigid light pipes 318 may be provided as an integrated structure (e.g., with the status indicator frame 316 and rigid light pipes 318 provided as a single molded piece). The/rigid light pipes 318 extend along the status indicator frame 316 in a spaced apart orientation from each other. In particular, the spacing of the rigid light pipes 318 on the status indicator frame 316 allows for a plurality of status indicator frame slots 316a to be defined in the status indicator frame 316, which in turn allows the rigid light pipes 318 to be positioned between heat dissipation fins and in heat dissipation device channels defined by a heat dissipation device (e.g., similar to the heat dissipation device 304 illustrated in FIG. 3A) when that heat dissipation device engages the top surface 302a of the base 302 (i.e., when that heat dissipation device is secured to the base 302 of the base 302 using the securing member 308.) As such, one of skill in the art in possession of the present disclosure will recognize that heat dissipation devices provided on the connector subsystem 300 illustrated in FIG. 3B (e.g., similar to the heat dissipation devices 304 and 306) will include respective heat dissipation fins that extend through the status indicator frame slots 316a when the status indicator subsystem 310 is mounted to that connector subsystem 300.

While not visible and/or described in detail, the status indicator subsystem 312 has similar features as the status indicator subsystem 310, including a status indicator board connector (e.g., similar to the status indicator board connector 314), a status indicator frame defining status indicator frame slots (e.g., similar to the status indicator frame 316 defining the status indicator frame slots 316a), and rigid light pipes (e.g., similar to the rigid light pipes 318.) As such, the rigid light pipes on the status indicator subsystem 312 may be positioned between heat dissipation fins and in heat dissipation device channels defined by a heat dissipation device that engage the top surface 302a of the base 302 on the connector subsystem 300 (e.g., similar to the heat dissipation device 306 discussed above with reference to FIG. 3A), similarly as described above with regard to the status indicator subsystem 310.

Figure 4:
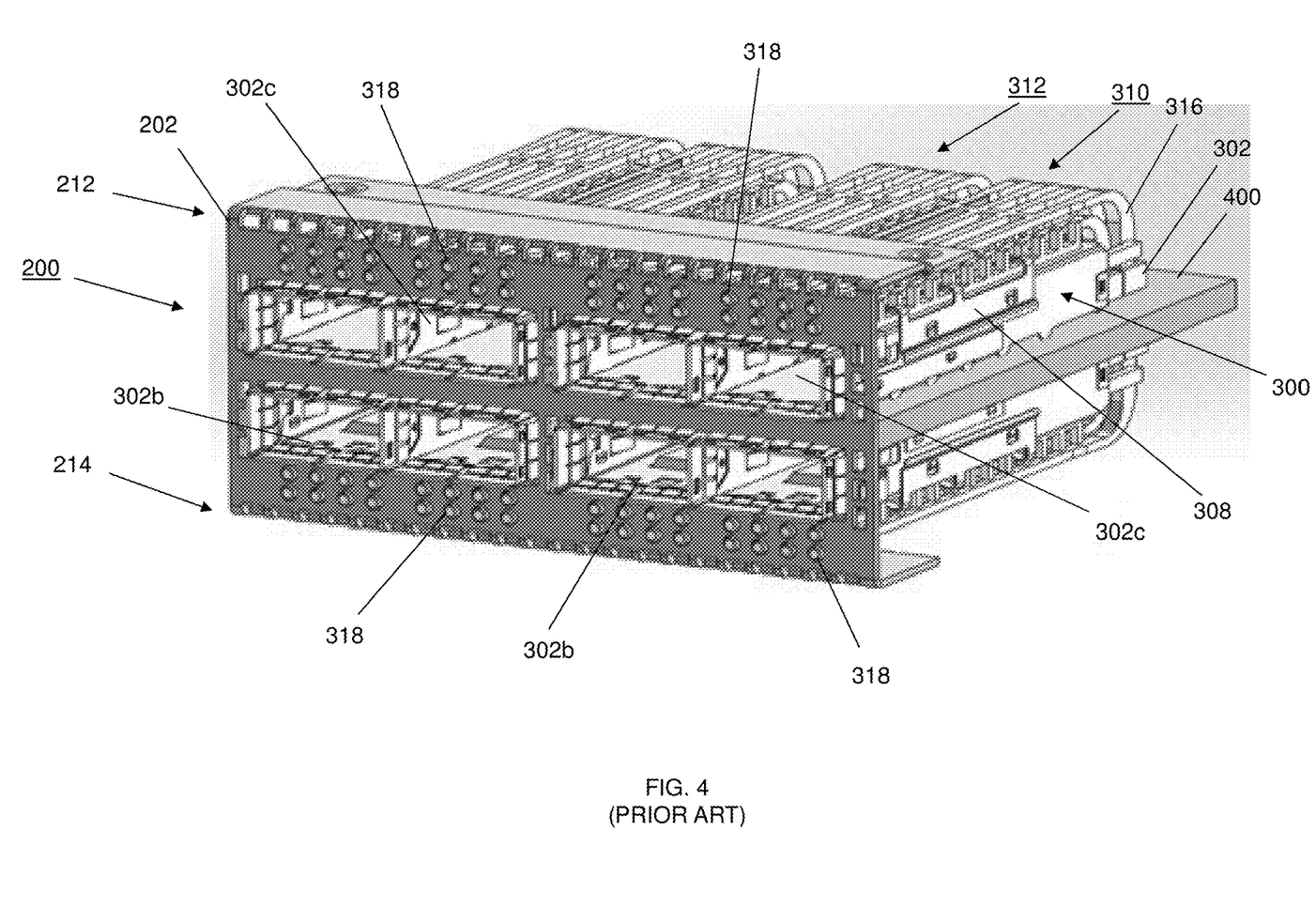
FIG. 4 is a perspective view illustrating a connector system including a plurality of the connector subsystems/conventional status indicator subsystems of FIG. 3B coupled to the conventional connector chassis of FIG. 2.

Referring now to FIG. 4, an embodiment of the conventional connector chassis 200 utilized with connector subsystems like the connector subsystem 300 of FIG. 3A, and status indicator subsystems like the status indicator subsystems 310 and 312 of FIG. 3B, is illustrated. As can be seen, a board 400 may be provided which may include a variety of components, couplings, and/or other features that would be apparent to one of skill in the art in possession of the present disclosure. In particular, a processing subsystem (not illustrated, but which may include the processor 102 discussed above with reference to FIG. 1) may be mounted or coupled to the board 400 in order to enable the processing system to communicate with other devices mounted to the board 400 (e.g., the connector subsystems and status indicator devices described herein.)

As such, a plurality of connector subsystems similar to the connector subsystem 300 may be mounted to the board 400. For example, in FIG. 4, a pair of the connector subsystems 300 are mounted side-by-side on a top surface of the board 400, and a pair of the connector subsystems 300 are mounted side-by-side on a bottom surface of the board 400 that is opposite the board 400 from the top surface. Status indicator subsystems similar to the status indicator subsystems 310 and 312 may then be mounted to the board 400 and coupled to respective connector subsystems 300 (e.g., positioned in the heat dissipation channels defined by the heat dissipation devices on the top surfaces of those connector subsystems 300.) The connector subsystems 300 and/or the board 400 are then mounted to the conventional connector chassis 200 such that the connector channels 302b and 302c on each connector subsystem 300 are accessible via a respective connector aperture 204, 206, 208, and 210, with the rigid light pipes on the status indicator subsystems 310 and 312 located adjacent and/or extending through the status indicator apertures 204a-d, 206a-d, 208a-d, and 208a-d, respectively, as illustrated in FIG. 4.

As discussed above, the positioning of the rigid light pipes on the status indicator subsystems in the status indicator apertures defined by the conventional connector chassis 200, as well as their positioning in the heat dissipation device channels defined by the heat dissipation devices (e.g., the channels defined by the fins on the heat sinks) that engage the connector subsystems 300, impedes airflow that could otherwise be received from outside the conventional connector chassis 200 (e.g., opposite the wall 202 from the connector subsystems 300 in FIG. 4), as it is only the airflow apertures 212 and 214 defined by the conventional connector chassis 200 that allow airflow into the conventional connector chassis 200. As such, airflow through the heat dissipation device channels defined by the heat dissipation devices (e.g., the channels defined by the fins on the heat sinks) that engage the connector subsystems 300 is impeded as well. As such, the provisioning of status indications on the system illustrated in FIG. 4 (and similar systems) substantially reduces the ability to provide proper and/or desired cooling for the connector subsystems 300, which can lead to issues with those connector subsystems, and/or effect the operation and/or accessibility of devices connected to them.

Figure 5:
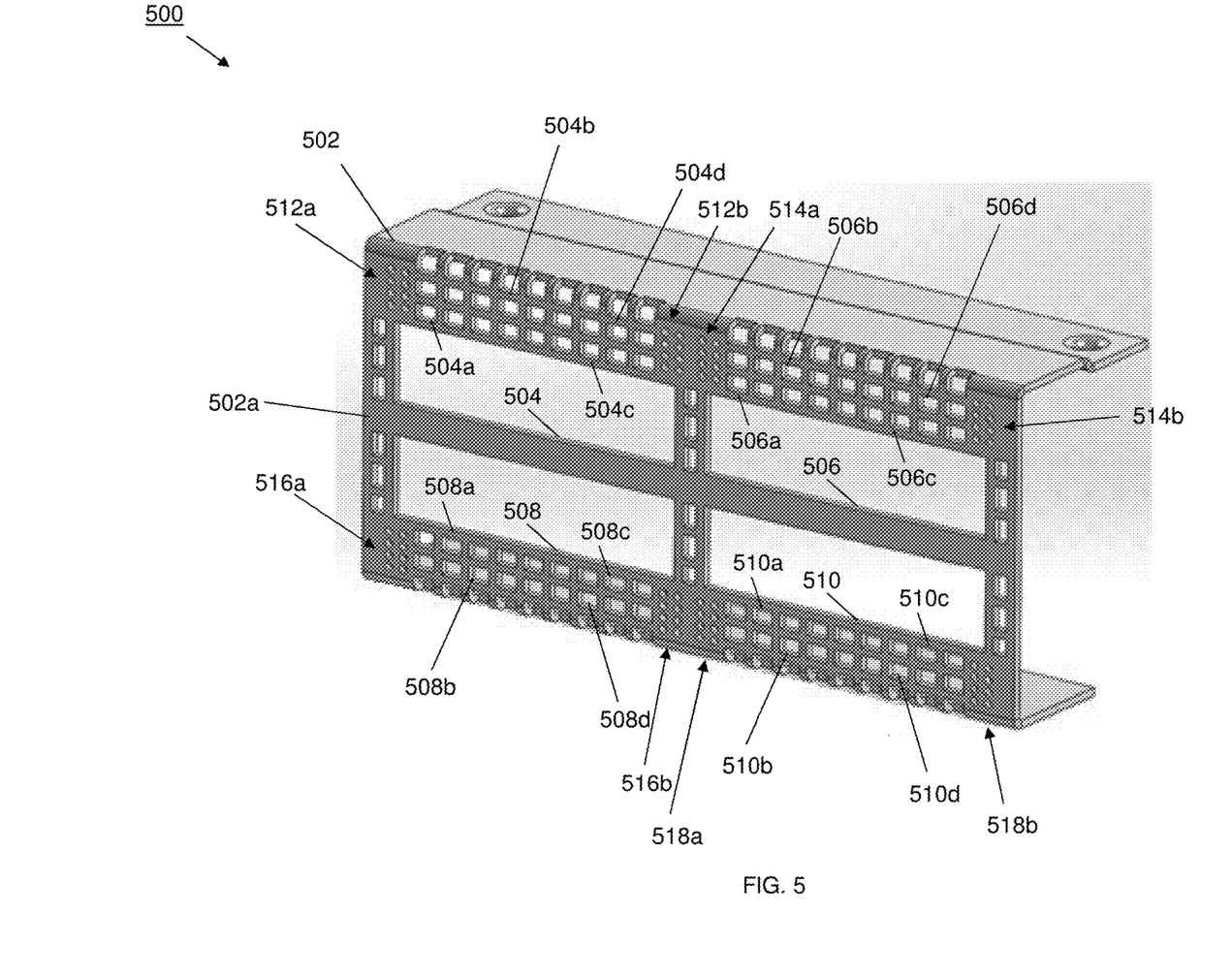
FIG. 5 is a perspective view illustrating an embodiment of a connector chassis according to the teachings of the present disclosure.

Referring now to FIG. 5, an embodiment of a connector chassis 500 provided according to the teachings of the present disclosure is illustrated. As would be understood by one of skill in the art in possession of the present disclosure, the connector chassis 500 may be provided in, or included as part of, a computing device chassis such as, for example the chassis 116 of the IHS 100 discussed above with reference to FIG. 1. In the illustrated embodiment, the conventional connector chassis 500 includes a base 502 having a wall 502a that may, for example, provide an outer surface of the chassis 116. However, in other embodiments, the base 502 may be positioned in the chassis 116 such that the wall 502a engages an inner surface of the chassis 116 so that the features of the connector chassis 500 are accessible through that chassis 116 (e.g., via one or more apertures defined by the chassis 116.)

In the illustrated embodiment, the base 502 of the conventional connector chassis 500 defines a connector aperture 504 that extends through the wall 502a, a connector aperture 506 that extends through the wall 502a, a connector aperture 508 that extends through the wall 502a, and a connector aperture 510 that extends through the wall 502a. One of skill in the art in possession of the present disclosure will recognize that the embodiment of the connector chassis 500 illustrated in FIG. 5 provides connector apertures 504, 506, 508, and 510 that are configured to provide access to four Quad Small Form-factor Pluggable Double Density (QSFP-DD) connector subsystems. However, connector chassis provided according to the teachings of the present disclosure may be provided with connector apertures configured for different types of connectors, and/or different connector configurations other than those illustrated, while remaining within the scope of the present disclosure as well.

In the illustrated embodiment, the base 502 of the connector chassis 500 defines airflow apertures associated with each respective connector aperture. For example, the base 502 of the connector chassis 500 defines a plurality of airflow apertures that are associated with the connector aperture 504, that extend through the wall 502a, and that include airflow apertures 504a, 504b, 504c, and up to 504d; a plurality of airflow apertures that are associated with the connector aperture 506, that extend through the wall 502a, and that include airflow apertures 506a, 506b, 506c, and up to 506d; a plurality of airflow apertures that are associated with the connector aperture 508, that extend through the wall 502a, and that include airflow apertures 508a, 508b, 508c, and up to 508d; and a plurality of airflow apertures that are associated with the connector aperture 510, that extend through the wall 502a, and that include airflow apertures 510a, 510b, 510c, and up to 510d. However, while each of the connector apertures 504, 506, 208, and 510 are illustrated as associated with a particular number of airflow apertures (e.g., 27 airflow apertures each in the illustrated embodiment), one of skill in the art in possession of the present disclosure will recognize that connector chassis provided according to the teachings of the present disclosure may utilize fewer or more airflow apertures in different situations as well.

The base 502 of the connector chassis 500 also defines status indicator apertures that are associated with each respective connector aperture, and that are separate and distinct from the airflow apertures 504a-d, 506a-d, 508a-d, and 510a-d. For example, the base 502 of the connector chassis 500 defines a plurality of status indicator apertures 512a and 512b that are associated with the connector aperture 504, that extend through the wall 502a, and that are located on opposite sides of the airflow aperture 504a-d in the illustrated embodiment; a plurality of status indicator apertures 514a and 514b that are associated with the connector aperture 506, that extend through the wall 502a, and that are located on opposite sides of the airflow apertures 506a-d in the illustrated embodiment; a plurality of status indicator apertures 516a and 516b that are associated with the connector aperture 508, that extend through the wall 502a, and that are located on opposite sides of the airflow apertures 508a-d in the illustrated embodiment; and a plurality of status indicator apertures 518a and 518b that are associated with the connector aperture 510, that extend through the wall 502a, and that are located on opposite sides of the airflow apertures 510a-d in the illustrated embodiment. However, while each of the connector apertures 504, 506, 208, and 510 are illustrated as associated with a particular number of status indicator apertures (e.g., sets of 8 status indicator apertures defined on each side of its associated airflow apertures in the illustrated embodiment), one of skill in the art in possession of the present disclosure will recognize that connector chassis provided according to the teachings of the present disclosure may utilize fewer or more status indicator apertures in different situations as well. While a specific connector chassis has been illustrated and described, one of skill in the art in possession of the present disclosure will recognize that connector chassis with different connector aperture, airflow aperture, and status indicator aperture configurations will fall within the scope of the present disclosure as well.

Figure 6:
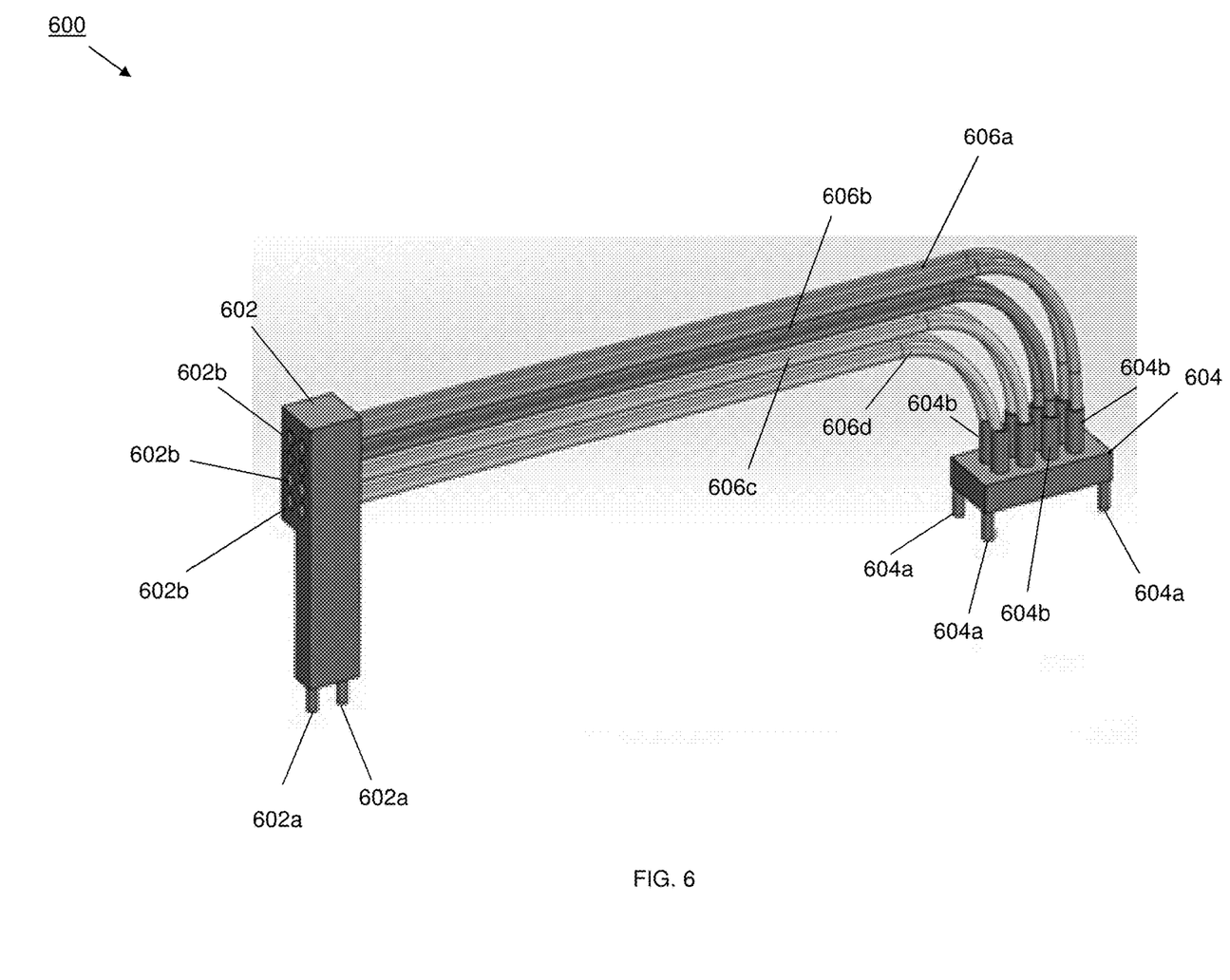
FIG. 6 is a perspective view illustrating an embodiment of a status indicator subsystem according to the teachings of the present disclosure.

Referring now to FIG. 6, an embodiment of a status indicator subsystem 600 provided according to the teachings of the present disclosure is illustrated. In the illustrated embodiment, the status indicator subsystem 600 includes a first status indicator coupling 602 that is coupled to a second status indicator coupling 604 by a plurality of light transmitting conduits such as the light transmitting conduits 606a, 606b, 606c, and up to 606d, illustrated in FIG. 6. The first status indicator coupling 602 includes a plurality of board pegs 602a that, as discussed below, are configured to engage a board, and defines a plurality of light transmitting conduit channels 602b through which the light transmitting conduits 606a-d extend such that a light emitting element on each light transmitting conduit is visible through the first status indicator coupling 602. In a specific embodiment, the light transmitting conduits may be provided by flexible optical cables that are configured to emit light via a light emitting element located on an end of each of those flexible optical cables (i.e., with that light emitting element positioned adjacent (or extending through) the exit of the light transmitting conduit channels 602b.) Such flexible optical cables may be provided with smaller diameters (i.e., relative to conventional, injection molded rigid light pipes) on the order of 1 millimeter, which further minimizes the airflow impedance provided by the status indicator subsystems, provides flexibility in light transmitting conduit mounting and routing, and minimizes the tooling costs associated with molding rigid light pipes. In some embodiments, the smaller diameter of the flexible optical cables may allow for their routing through the heat dissipation device channels defined by the heat dissipation devices (e.g., due to space constraints within a chassis), or above the heat dissipation devices, without substantially impeding airflow past the heat dissipation devices.) However, in other embodiments, other types of light transmitting conduits, status indicator couplings, and/or light emitting devices may be utilized according to the teachings of the present disclosure.

The second status indicator coupling 604 includes a plurality of board pegs 604a that, as discussed below, are configured to engage a board, and includes a plurality of light transmitting conduit couplings 604b that are configured to receive the light transmitting conduits 606a-d. As discussed below, the second status indicator coupling 604 may be configured (e.g., via apertures or other openings defined on a bottom surface of the second status indicator coupling 604, not illustrated) to allow light from light emitting devices (e.g., located on a board to which the second status indicator coupling 604 is mounted) to enter the light transmitting conduits 606a-d (e.g., via an end of the light transmitting conduits 606a-d that is configured to receive light.) While a specific status indicator subsystem 600 has been illustrated and described, one of skill in the art in possession of the present disclosure will recognize that status indicator subsystems may be provided according to the teachings of the present disclosure in a variety of manners that may depend on, for example, the specific configuration of the connector subsystem and/or the connector chassis.

Figure 7:
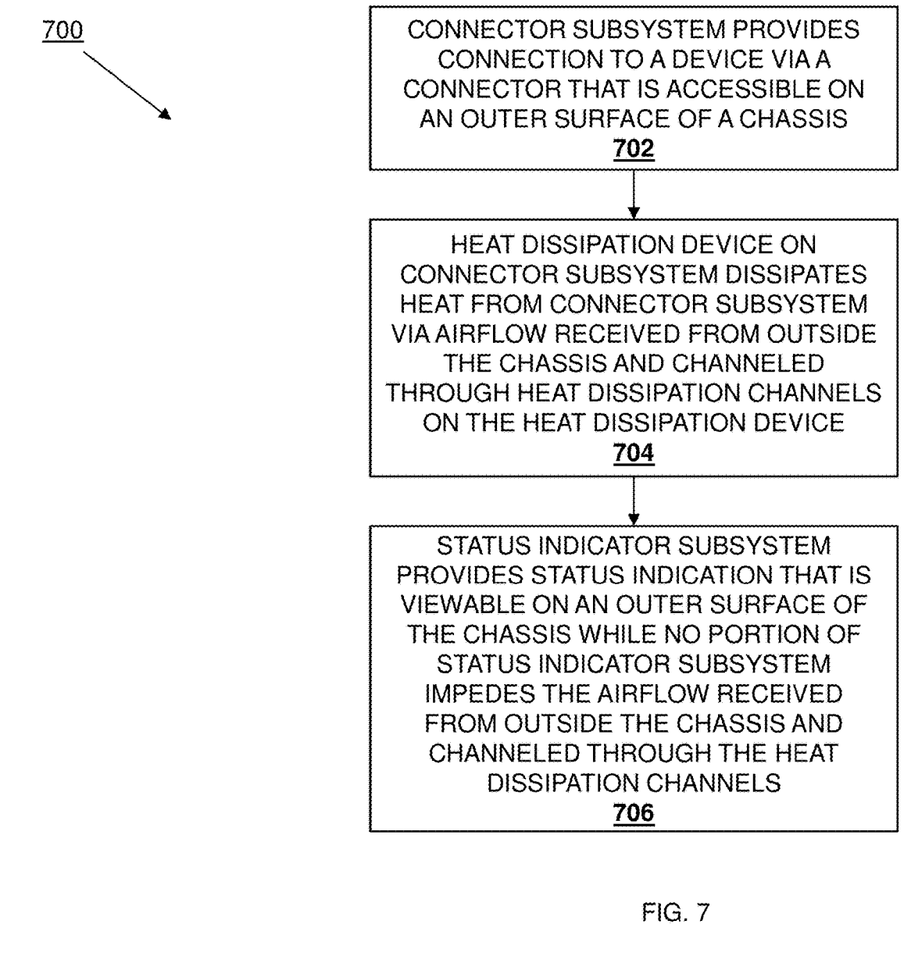
FIG. 7 is a flow chart view illustrating an embodiment of a method for providing connector cooling and status indications.

Referring now to FIG. 7, an embodiment of a method 700 for providing connector cooling and status indications is illustrated. As discussed below, the systems and methods of the present disclosure provide for status indications adjacent connector subsystems such as the QSFP-DD connector subsystems discussed above, without impeding airflow through a connector chassis or heat dissipation devices on the connector subsystems, thus ensuring proper and/or desired cooling of those connector subsystems. This may be accomplished, at least in part, by providing a connector chassis that includes connector apertures as well as, for each connector aperture, associated airflow apertures and status indicator apertures that are separate and distinct from each other. Respective connector subsystems may then be provided adjacent the connector apertures on the connector chassis, and respective status indicator subsystems may be provided adjacent those connector subsystems as well as the status indicator apertures on the connector chassis such that no portion of those status indicator subsystems impedes airflow that is received through the airflow apertures and that is channeled through heat dissipation device channels defined by heat dissipation devices on the connector subsystems. As such, the status indicator subsystems may operate to provide status indications without having the negative effects on the cooling of the connector subsystems introduced by conventional status indicator subsystems.

Figure 8:
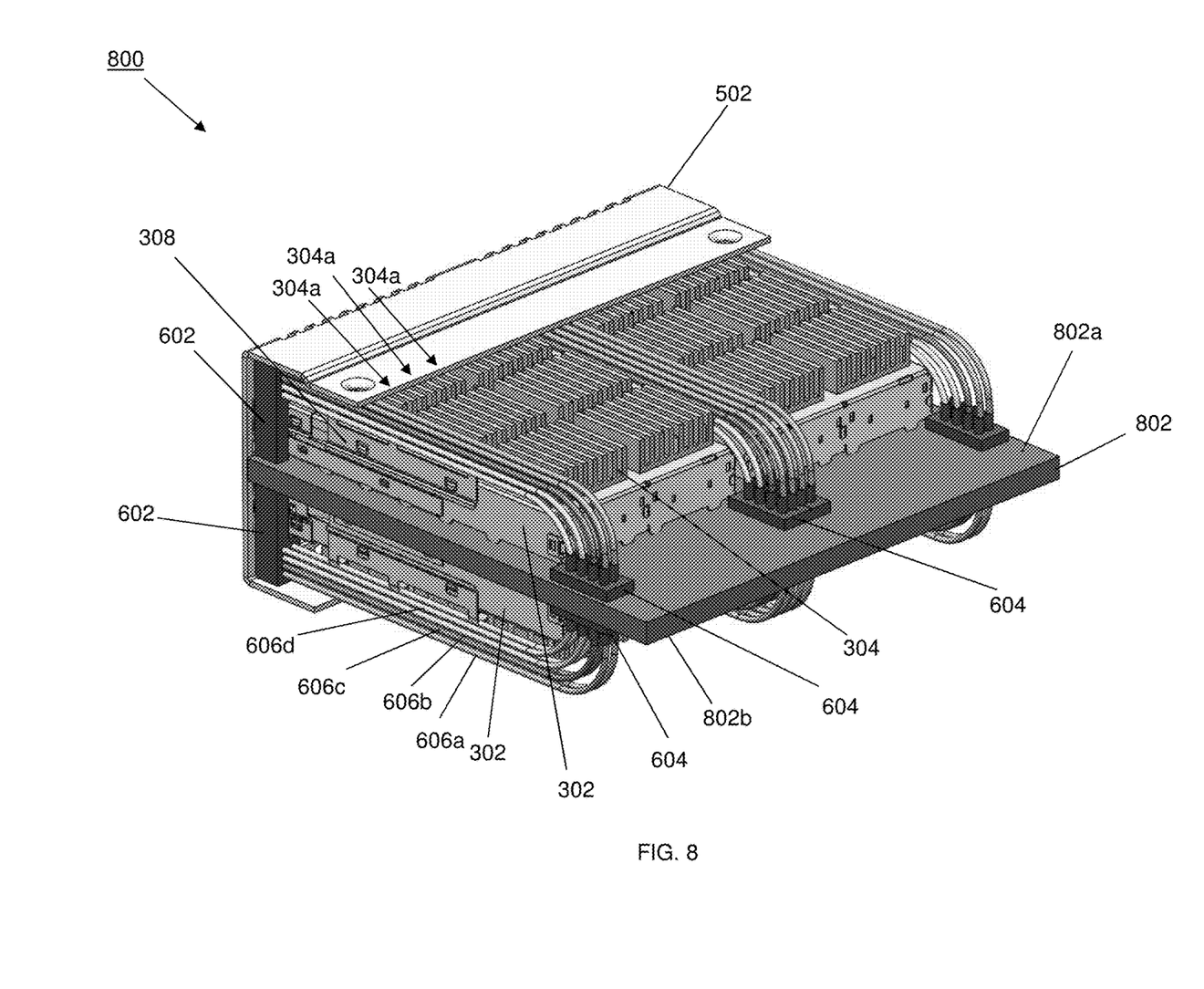
FIG. 8 is a perspective view illustrating a connector cooling and status indicator system having a plurality of the connector subsystems of FIG. 3A and status indicator subsystems of FIG. 6 coupled to the connector chassis of FIG. 5.

With reference to FIGS. 3A, 5, 6, and 8, prior to the method 700, the connector cooling and status indicator system of the present disclosure may be assembled using connector subsystems similar to the connector subsystem 300 illustrated and described above with reference to FIG. 3A, the connector chassis 500 illustrated and described above with reference to FIG. 5, and status indicator subsystems similar to the status indicator subsystem 600 illustrated and described above with reference to FIG. 6. FIG. 8 illustrates an embodiment of a connector cooling and status indicator system 800 of the present disclosure after assembly. As can be seen, a board 802 may be provided which may include a variety of components, couplings, and/or other features that would be apparent to one of skill in the art in possession of the present disclosure. In particular, a processing subsystem (not illustrated, but which may include the processor 102 discussed above with reference to FIG. 1) may be mounted or coupled to the board 802 in order to enable the processing system to communicate with and/or via other devices mounted to the board 802 (e.g., the connector subsystems 300 and status indicator devices 600 described herein.)

As such, a plurality of connector subsystems similar to the connector subsystem 300 may be mounted to the board 802. For example, in the connector cooling and status indicator system 800 illustrated in FIG. 8, a pair of the connector subsystems 302 are mounted side-by-side on a top surface 802a of the board 802, and a pair of the connector subsystems 302 are mounted side-by-side on a bottom surface 802b of the board 802 that is opposite the board 800 from the top surface 802a. While not illustrated in detail, one of skill in the art in possession of the present disclosure will recognize that the connector subsystems 302 may be communicatively coupled to the board 802 and, as such, to devices (e.g., the processing system discussed above) that are also coupled to the board 802. With the connector subsystems 300 coupled to the board 802, and either or both of the connectors subsystems 302 and the board 802 connected to the connector chassis 500, a pair of connector channels 302b and 302c defined by the base 302 of each connector subsystem 300 are accessible through each respective connector aperture 504, 506, 508, and 510 on the connector chassis 500 in the connector cooling and status indicator system 800.

Pairs of the status indicator subsystems 600 may then be mounted to the board 802 on opposite sides of each of the connector subsystems 302. The mounting of each status indicator subsystem 600 to the board 802 may include engaging the first status indicator coupling 602 (e.g., the board pegs 602a in FIG. 6) with the board 802 adjacent the connector chassis 500, and engaging the second status indicator coupling 604 (e.g., the board pegs 604a) with the board 802 at a location on the board 802 that is spaced apart from the connector chassis 500 by approximately the length of the connector subsystem 302, as illustrated in FIG. 8. The mounting of the first status indicator coupling 602 to the board 802 adjacent the connector chassis 500 positions the light emitting elements on each status indicator subsystem 600, which are located on a distal end of each of the light transmitting conduits and positioned adjacent an exit of the light transmitting conduit channels 602b defined by the first status indicator coupling 602, as discussed above, immediately adjacent respective status indicator apertures 512a, 512b, 514a, 514b, 516a, 516b, 518a, and 518b defined by the connector chassis 500.

As can be seen in FIG. 8, the configuration and mounting of the pair of status indicator subsystems 600 on opposite sides of each connector subsystem 300 ensures that the light transmitting conduits 606a-d on the status indicator subsystems 600 are positioned adjacent the connector subsystems 300, and no portion of the status indicator subsystems 600 (and, in particular, the light transmitting conduits 606a-d) is located in and/or adjacent the airflow apertures 504a-d, 506a-d, 508a-d, and 510a-d, or in the heat dissipation device channels (e.g., the heat dissipation device channels 304a or other channels defined between fins on a heat sink) defined by the heat dissipation devices (e.g., the heat dissipation device 304), such that no portion of the status indicator subsystems 600 impedes airflow that is received through those airflow apertures 504a-d, 506a-d, 508a-d, and 510a-d, and channeled through those heat dissipation device channels, as discussed below.

The method 700 begins at block 702 where a connector subsystem provides a connection to a device via a connector that is accessible on an outer surface of a chassis. In an embodiment, at block 702, any of the connector subsystems 300 in the connector cooling and status indicator system 800 of FIG. 8 may receive a connector via one or more of the connector channels 302b and 302c, and that connector may be coupled to any of a variety of devices that would be apparent to one of skill in the art in possession of the present disclosure. Furthermore, one of skill in the art in possession of the present disclosure will recognize that the connection to any of the connector subsystems 300 provides a corresponding connection to the board 802, and thus a connection to any devices (e.g., the processing system discussed above) that may be connected to that board 802 as well.

The method 700 then proceeds to block 704 where a heat dissipation device on the connector subsystem dissipates heat from the connector subsystem via an airflow that is received from outside the chassis and that is channeled through heat dissipation channels on the heat dissipation device. In an embodiment, at block 704, any of the heat dissipation devices in the connector cooling and status indicator system 800 of FIG. 8 (e.g., the heat dissipation device 304) that is located on an operating connector subsystem 300 may operate to receive an airflow from outside the connector chassis 500 via its associated airflow apertures (e.g., the heat dissipation device 304 illustrated in FIG. 8 may receive the airflow via one or more of the airflow apertures 506a-d), and channel that airflow through its heat dissipation device channels (e.g., the heat dissipation device channels 304a.) For example, a fan system within (or coupled to) the connector chassis 500 (or the chassis 116) may be operate to generate an airflow that may be drawn (or exhausted) through any of the airflow apertures defined by the connector chassis 500, and channeled through the heat dissipation device channels defined by the heat dissipation devices included on the connector subsystems 300. Furthermore, as discussed above, due to the configuration and positioning of the status indicator subsystems, no portion of any of the status indicator subsystems operates to impede the airflow that is drawn (or exhausted) through any of the airflow apertures defined by the connector chassis 500, and channeled through the heat dissipation device channels defined by the heat dissipation devices included on the connector subsystems 300. As such, at block 704, heat produced by the connector subsystems 300 is dissipated by their respective heat dissipation devices using the airflow discussed above.

The method 700 then proceeds to block 706 where a status indicator subsystem provides a status indication that is viewable on an outer surface of the chassis while no portion of the status indicator subsystem impedes the airflow that is received from outside the chassis and that is channeled through heat dissipation channels on the heat dissipation device. In an embodiment, at block 706, any of the status indicator subsystems 600 in the in the connector cooling and status indicator system 800 of FIG. 8 may operate to provide status indications that may be viewed through the status indicator apertures 512a, 512b, 514a, 514b, 516a, 516b, 518a, and 518b defined by the connector chassis 500. In some embodiments, each status indicator subsystem 600 may be configured to provide status indications that indicate the status of the connection provided by a connector engaging its adjacent connector channel. For example, a processing system coupled to the board 802 may monitor the connection provided via any connector channel on a connector subsystem 300 and, in response, cause light emitting devices on the board 802 to illuminate to indicate the status of those connections. By illuminating light emitting devices on the board 802 adjacent the second status indicator coupling 604 of a particular status indicator subsystem 600, the status of a connection provided by an adjacent connector channel on a connector subsystem may be viewed through the status indicator apertures adjacent that connector channel (i.e., due to the light transmitting conduits transmitting the light from those light emitting devices to their light emitting elements that are positioned adjacent the status indicator apertures.) Furthermore, as discussed above, such status indication may be provided while no portion of any of the status indicator subsystems operates to impede the airflow that is drawn (or exhausted) through any of the airflow apertures defined by the connector chassis 500, and channeled through the heat dissipation device channels defined by the heat dissipation devices included on the connector subsystems 300.

Thus, systems and methods have been described that provide for status indications adjacent connector subsystems, such as the QSFP-DD connector subsystems, without impeding airflow through heat dissipation devices on the connector subsystems, thus ensuring proper and/or desired cooling of those connector subsystems. This is accomplished, at least in part, via a connector chassis that includes connector apertures as well as, for each connector aperture, associated airflow apertures and status indicator apertures that are separate from each other. Respective connector subsystems are located adjacent the connector apertures, and respective status indicator subsystems are located adjacent the status indicator apertures and the connector subsystems such that no portion of those status indicator subsystems impedes airflow that is received (or expelled) through the airflow apertures and that is channeled through airflow channels defined by heat dissipation devices on the connector subsystems. As such, the status indicator subsystems operate to provide status indications without having the negative effects on the cooling of the connector subsystems that is seen when conventional status indicator subsystems are utilized.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A connector cooling and status indication system, comprising:
  a connector chassis that defines:
    a connector aperture;

an airflow aperture located adjacent the connector aperture; and
a status indicator aperture that is located adjacent the connector aperture;
a connector subsystem that includes a connector that is located immediately adjacent the connector aperture, wherein the connector subsystem includes a heat dissipation device that extends from the connector subsystem and that defines at least one heat dissipation device channel that is configured to channel an airflow received via the airflow aperture; and
a status indicator subsystem that includes a light emitting element that is located immediately adjacent the status indicator aperture, wherein the status indicator subsystem is positioned adjacent the connector subsystem such that no portion of the status indicator subsystem impedes the airflow that is received via the airflow aperture and channeled by the at least one heat dissipation device channel.

2. The system of claim 1, wherein the light emitting element includes a light transmitting conduit that extends between a first status indicator coupling that is included on the status indicator subsystem and that is connected to the connector chassis, and a second status indicator coupling that is included on the status indicator subsystem and that is connected to a board, and wherein no portion of the light transmitting conduit is located in the at least one heat dissipation device channel.

3. The system of claim 2, wherein the light transmitting conduit is a flexible light emitting conduit.

4. The system of claim 1, further comprising:
a plurality of airflow aperture defined by the connector chassis adjacent the connector aperture, wherein the heat dissipation device defines a plurality of heat dissipation device channels, and wherein each of the plurality of heat dissipation device channels is configured to channel an airflow received via a respective one of the plurality of airflow apertures.

5. The system of claim 1, wherein the status indicator aperture is a first status indicator aperture that is located on a first side of the connector aperture, and the status indicator subsystem is a first status indicator subsystem, and wherein the system further comprises:
a second status indicator aperture that is located on a second side of the connector aperture that is opposite the first side; and
a second status indicator subsystem that includes a light emitting element that is located immediately adjacent the second status indicator aperture, wherein the second status indicator subsystem is positioned adjacent the connector subsystem such that no portion of the second status indicator subsystem impedes the airflow received via the airflow aperture and channeled by the at least one heat dissipation device channel.

6. The system of claim 1, wherein the connector subsystem is a Quad Small Form-factor Pluggable (QSFP) connector subsystem.

7. An Information Handling System (IHS), comprising:
a chassis;
a connector subsystem that includes a connector that is accessible on an outer surface of the chassis;
a heat dissipation device that extends from the connector subsystem and that defines at least one heat dissipation device channel that is configured to channel an airflow received from outside the chassis; and
a status indicator subsystem that includes a light emitting element that is viewable on an outer surface of the chassis, wherein the status indicator subsystem is positioned adjacent the connector subsystem such that no portion of the status indicator subsystem impedes the airflow that is received from outside the chassis and channeled by the at least one heat dissipation device channel.

8. The IHS of claim 7, wherein the light emitting element includes a light transmitting conduit that extends between a first status indicator coupling that is included on the status indicator subsystem and that is connected to the chassis, and a second status indicator coupling that is included on the status indicator subsystem and that is connected to a board that is housed in the chassis, and wherein no portion of the light transmitting conduit is located in the at least one heat dissipation device channel.

9. The IHS of claim 8, wherein the light transmitting conduit is a flexible light emitting conduit.

10. The IHS of claim 7, wherein the heat dissipation device defines a plurality of heat dissipation device channels, and wherein each of the plurality of heat dissipation device channels is configured to channel an airflow received from outside the chassis.

11. The IHS of claim 7, wherein the status indicator subsystem is a first status indicator subsystem that is positioned on a first side of the connector subsystem, and wherein the IHS further comprises:
a second status indicator subsystem that includes a light emitting element that is viewable on an outer surface of the chassis, wherein the second status indicator subsystem is positioned on a second side of the connector subsystem that is opposite the first side, and wherein no portion of the second status indicator subsystem impedes the airflow that is received from outside the chassis and channeled by the at least one heat dissipation device channel.

12. The IHS of claim 7, wherein the connector subsystem is a Quad Small Form-factor Pluggable (QSFP) connector subsystem.

13. The IHS of claim 7, further comprising:
a board that is housed in the chassis, wherein the connector subsystem is mounted to the board, and wherein the status indicator subsystem is mounted to the board; and
a processing system that is mounted to the board and coupled to each of the connector subsystem and the status indicator subsystem.

14. A method for providing connector cooling and status indications, comprising:
providing, via a connector subsystem that includes a connector that is accessible on an outer surface of a chassis, a connection to a device;
dissipating, via a heat dissipation device that extends from the connector subsystem and that defines at least one heat dissipation device channel, heat from the connector via an airflow received from outside the chassis and channeled through the at least one heat dissipation device channel; and
providing, via a status indicator subsystem that is positioned adjacent the connector subsystem such that no portion of the status indicator subsystem impedes the airflow that is received from outside the chassis and channeled by the at least one heat dissipation device channel, a status indication using a light emitting element that is included in the status indicator subsystem and that is viewable on an outer surface of the chassis.

15. The method of claim 14, wherein the light emitting element includes a light transmitting conduit that extends between a first status indicator coupling that is included on the status indicator subsystem and that is connected to the chassis, and a second status indicator coupling that is included on the status indicator subsystem and that is connected to a board that is housed in the chassis, and wherein no portion of the light transmitting conduit is located in the at least one heat dissipation device channel.

16. The method of claim 15, wherein the light transmitting conduit is a flexible light emitting conduit.

17. The method of claim 14, wherein the heat dissipation device defines a plurality of heat dissipation device channels, and wherein each of the plurality of heat dissipation device channels dissipates heat from the connector via an airflow received from outside the chassis and channeled through each of the plurality of heat dissipation device channels.

18. The method of claim 14, wherein the status indicator subsystem is a first status indicator subsystem that is positioned on a first side of the connector subsystem and that provides a first status indication, and wherein the method further comprises:
providing, via a second status indicator subsystem that is positioned on a second side of the connector subsystem that is opposite the first side such that no portion of the second status indicator subsystem impedes the airflow that is received from outside the chassis and channeled by the at least one heat dissipation device channel, a second status indication using a light emitting element that is included in the second status indicator subsystem and that is viewable on an outer surface of the chassis.

19. The method of claim 14, wherein the connector subsystem is a Quad Small Form-factor Pluggable (QSFP) connector subsystem.

20. The method of claim 14, further comprising:
communicating, by a processing system that is mounted to a board that is housed in the chassis, with the connector subsystem that is mounted to the board, and the status indicator subsystem that is mounted to board.

* * * * *